US012689281B2

(12) United States Patent
Li et al.

(10) Patent No.: US 12,689,281 B2
(45) Date of Patent: Jul. 21, 2026

(54) CONTROL SYSTEM FOR LLC VOLTAGE CONVERTER USING UP-DOWN COUNTER CONFIGURED TO REACT TO COMPARATOR OUTPUT

(71) Applicant: TEXAS INSTRUMENTS INCORPORATED, Dallas, TX (US)

(72) Inventors: Longqi Li, Maoming City (CN); Desheng Guo, Shanghai (CN)

(73) Assignee: Texas Instruments Incorporated, Dallas, TX (US)

( * ) Notice: Subject to any disclaimer, the term of this patent is extended or adjusted under 35 U.S.C. 154(b) by 249 days.

(21) Appl. No.: 18/674,698

(22) Filed: May 24, 2024

(65) Prior Publication Data

US 2025/0364883 A1      Nov. 27, 2025

(51) Int. Cl.
| | |
|---|---|
| *H02M 3/335* | (2006.01) |
| *H02M 1/00* | (2007.01) |
| *H02M 1/08* | (2006.01) |
| *H02M 3/00* | (2006.01) |
| *H03K 21/02* | (2006.01) |
| *H03K 21/38* | (2006.01) |

(52) U.S. Cl.
CPC ........... *H02M 1/0003* (2021.05); *H02M 1/08* (2013.01); *H02M 3/01* (2021.05); *H03K 21/026* (2013.01); *H03K 21/38* (2013.01)

(58) Field of Classification Search
CPC ......... H02M 3/33507; H02M 3/33515; H02M 3/33571; H02M 3/01; H02M 1/0003; H02M 1/0025; H03K 21/026; H03K 21/38
See application file for complete search history.

(56) References Cited

U.S. PATENT DOCUMENTS

| | | | | |
|---|---|---|---|---|
| 9,991,801 B2 * | 6/2018 | Wang | .................. | H02M 3/3376 |
| 2015/0263629 A1 * | 9/2015 | Stuler | .............. | H02M 3/33546 |
| | | | | 363/21.02 |
| 2022/0209674 A1 * | 6/2022 | Wang | .............. | H02M 3/33576 |
| 2022/0247320 A1 | 8/2022 | Stracquadaini et al. | | |

(Continued)

FOREIGN PATENT DOCUMENTS

| | | | | |
|---|---|---|---|---|
| EP | 4207568 A1 | 5/2023 | | |
| KR | 101884414 B1 * | 8/2018 | ........... | B64C 39/024 |

OTHER PUBLICATIONS

Texas Instruments Incorporated, "TMS320F28003x Real-Time Microcontrollers," Technical Reference Manual, Literature No. SPRUIW9B, Oct. 2021—Revised Jun. 2023, 3541 pages.

(Continued)

*Primary Examiner* — Sisay G Tiku
(74) *Attorney, Agent, or Firm* — Michelle F. Murray; Frank D. Cimino

(57) ABSTRACT

An inductor-inductor-capacitor (LLC) converter may include a control system that holds a duty cycle of control signals at a desired ratio, such as 50%. The control system may include a counter that is configured to count up and down and is further configured to generate event signals that are received at the inputs of a latch. An event signal may cause and output value of the latch to change from high to low or vice versa. There may be further circuits to add delay and/or inversion to generate multiple control signals from the output of the latch. Furthermore, the counter may be configured to switch from counting up to counting down in response to a comparator output.

20 Claims, 4 Drawing Sheets

(56) References Cited

U.S. PATENT DOCUMENTS

| 2022/0286056 A1* | 9/2022 | Chiu | ................ | H02M 3/33573 |
| 2022/0352824 A1* | 11/2022 | Chiu | ................ | H02M 3/33507 |
| 2023/0208403 A1* | 6/2023 | Jiang | .................... | H03K 3/023 |
| | | | | 327/295 |
| 2024/0204644 A1* | 6/2024 | Jiang | ................... | H02M 1/0022 |

OTHER PUBLICATIONS

International Search Report for PCT/2025/030575 dated Sep. 19, 2025.
NCP13992; "High Performance Current Mode Resonant Controller with Integrated High-Voltage Drivers" May 31, 2019; ON Semiconductor; pp. 1-30; Retrieved from Internet: https://datasheet.octopart.com/NCP13992AWDR2G-onsemi-datasheet-139012225.pdf. pp. 14-16.

* cited by examiner

400

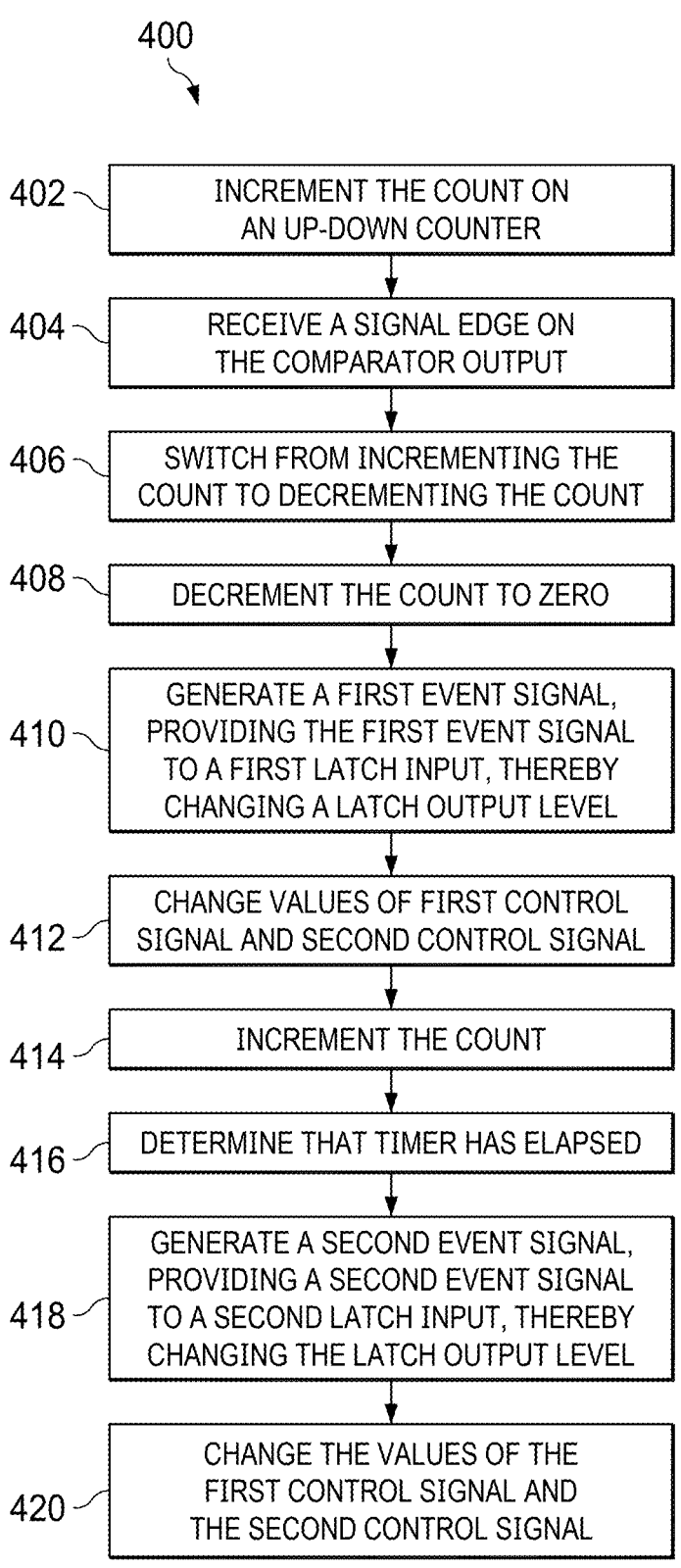

402 — INCREMENT THE COUNT ON AN UP-DOWN COUNTER

404 — RECEIVE A SIGNAL EDGE ON THE COMPARATOR OUTPUT

406 — SWITCH FROM INCREMENTING THE COUNT TO DECREMENTING THE COUNT

408 — DECREMENT THE COUNT TO ZERO

410 — GENERATE A FIRST EVENT SIGNAL, PROVIDING THE FIRST EVENT SIGNAL TO A FIRST LATCH INPUT, THEREBY CHANGING A LATCH OUTPUT LEVEL

412 — CHANGE VALUES OF FIRST CONTROL SIGNAL AND SECOND CONTROL SIGNAL

414 — INCREMENT THE COUNT

416 — DETERMINE THAT TIMER HAS ELAPSED

418 — GENERATE A SECOND EVENT SIGNAL, PROVIDING A SECOND EVENT SIGNAL TO A SECOND LATCH INPUT, THEREBY CHANGING THE LATCH OUTPUT LEVEL

420 — CHANGE THE VALUES OF THE FIRST CONTROL SIGNAL AND THE SECOND CONTROL SIGNAL

FIG. 4

CONTROL SYSTEM FOR LLC VOLTAGE CONVERTER USING UP-DOWN COUNTER CONFIGURED TO REACT TO COMPARATOR OUTPUT

TECHNICAL FIELD

The present description is related generally to inductor-inductor-capacitor (LLC) voltage converters and, more specifically, to a control system for LLC voltage converters, where such control system includes an up-down counter that is configured to react to a comparator output.

BACKGROUND

A direct current to direct current (DC-DC) converter is an electronic circuit or device that transforms a direct current (DC) voltage from one level to another. It serves the purpose of changing the voltage level while maintaining a continuous and stable output.

One type of DC-DC converter includes an inductor-inductor-capacitor (LLC) voltage converter, which may be used in various electronic devices and systems where the power requirements do not match the available power source. Examples of applications include power supplies for computers, battery-powered devices, solar power systems, and electric vehicles. Such converters may use switching elements (such as transistors) and control circuits to regulate the voltage and current flow.

In one example, a control circuit may provide control signals to switching transistors in an LLC converter. However, control systems may be imperfect, and some control systems may not be able to ensure that a duty cycle of a high-side switching transistor and a duty cycle of a low-side switching transistor are the same (or, at least, close enough to satisfy a particular application).

Some solutions use one or more configurable logic blocks (CLBs) to ensure symmetry in the duty cycles. However, while CLBs may be appropriate for some uses, CLBs may be relatively expensive.

There is a need for LLC converters having control systems that provide relatively robust control at lower cost.

SUMMARY

In one example, a circuit includes: a comparator having a first comparator input, a second comparator input, and a comparator output; a latch having a first latch input, a second latch input, and a latch output; an up-down counter having a first input, wherein the first input is coupled to the comparator output, further wherein: the first latch input is coupled to a first output of the up-down counter; the second latch input is coupled to a second output of the up-down counter; and the second latch input is coupled to the comparator output.

In another example, a voltage converter system includes: an inductor-inductor-capacitor (LLC) voltage converter having a resonant capacitor and a resonant inductor; and a control circuit configured to provide a first control signal and a second control signal to the LLC voltage converter, wherein the control circuit comprises: a comparator, which is configured to receive a first voltage signal from a terminal of the resonant capacitor and to receive a second voltage signal, which is a ramp signal, further wherein the comparator is configured to output a comparator output signal; an up-down counter, which is configured to receive the comparator output signal, further wherein the up-down counter is configured to output a first event signal in response to counting a preconfigured value; a latch having a first latch input and a second latch input, wherein the latch is configured to receive the first event signal at the first latch input and to receive a signal derived from the comparator output signal at the second latch input; and an output signal module, configured to receive a latch output from the latch and further configured to generate the first control signal and the second control signal from the latch output.

In yet another example, a voltage converter controller includes: a comparator configured to receive a feedback signal and a ramp signal, the comparator being further configured to output a comparator output; a pulse width modulation (PWM) module configured to receive the comparator output and to generate a first control signal and a second control signal, wherein the PWM module is configured to: increment a count on an up-down counter; receive a signal edge on the comparator output; switch from incrementing the count to decrementing the count on the up-down counter in response to the signal edge on the comparator output; decrement the count to zero; generate a first event signal in response to switching from incrementing the count to decrementing the count, including providing the first event signal to a first latch input, thereby changing a latch output level; changing values of the first control signal and the second control signal in response to the latch output level.

BRIEF DESCRIPTION OF THE DRAWINGS

Figure 1:
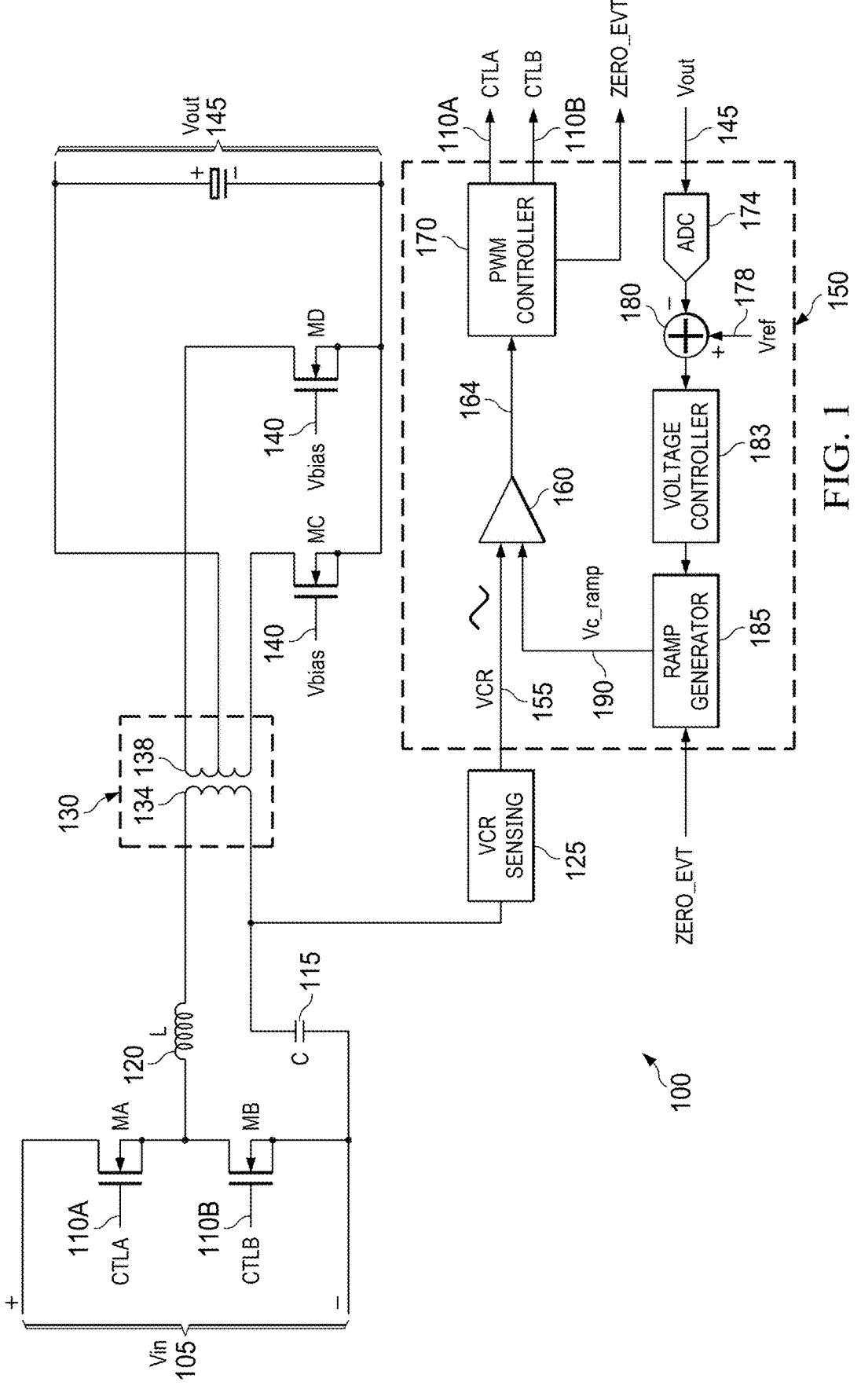

Having thus described the invention in general terms, reference will now be made to the accompanying drawings, wherein:

FIG. 1 is an illustration of an example LLC voltage converter with a control system, according to various embodiments.

Figure 2:
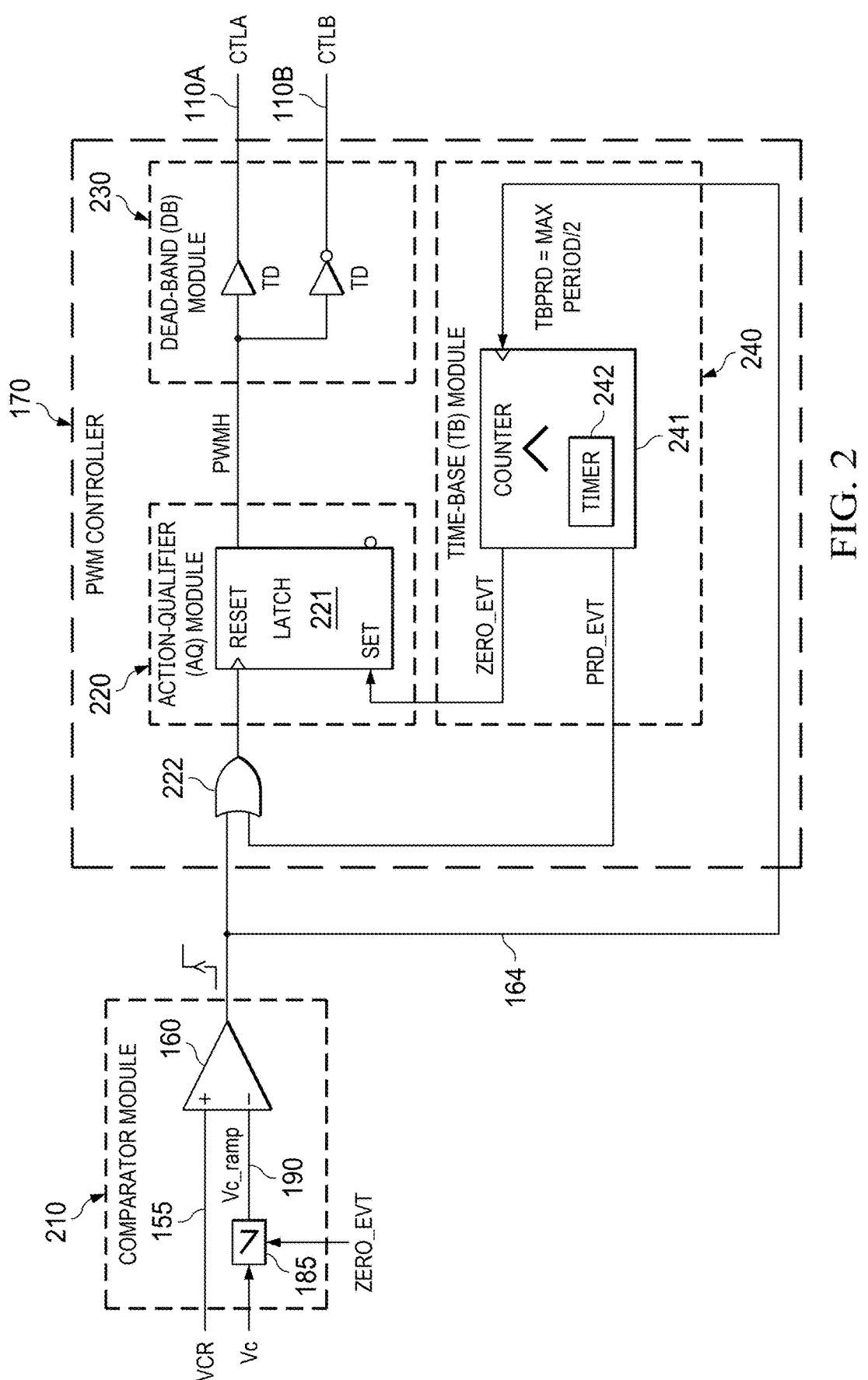

FIG. 2 is an illustration of an example control system for an LLC voltage converter, according to various embodiments.

Figure 3:
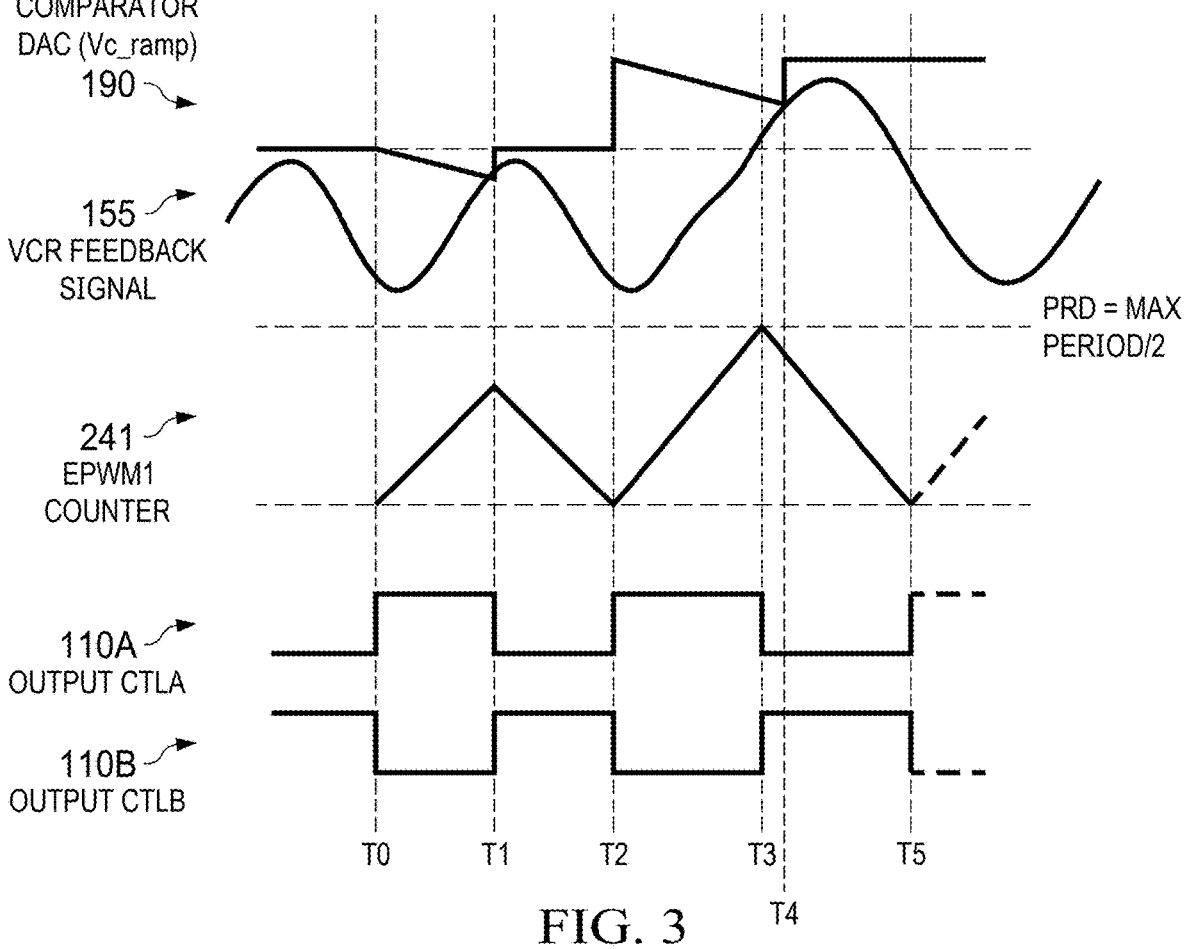

FIG. 3 is an illustration of an example timing relationships of signals, within an example control system, according to various embodiments.

FIG. 4 is an illustration of an example method for controlling an LLC voltage converter, according to various embodiments.

DETAILED DESCRIPTION

The present disclosure is described with reference to the attached figures. The figures are not drawn to scale, and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

Various embodiments include LLC voltage converters having control systems, where those control systems may employ up-down counters. In one example, a circuit may include a comparator that has a first comparator input, a second comparator input, and a comparator output. A pulse width modulation (PWM) controller may include a latch having a first latch input, second latch input, and a latch output. The latch may be configured to provide a PWM output used to control high- and low-side switches (e.g., transistors) within the LLC voltage converter. The PWM controller may further include an up-down counter having a first input, where the first input is coupled to the comparator output. Furthermore, the first latch input may be coupled to a first output of the up-down counter, the second latch input may be coupled to a second output of the up-down counter, and the second latch input may also be coupled to the comparator output.

Continuing with the example, a comparator edge (e.g., a rising edge from a comparator event) may cause the up-down counter to switch from incrementing (up count) to decrementing (down count). Furthermore, the latch may include a set-reset latch. The first latch input may be the set input, and the second latch input may be the reset input. The up-down counter may be configured to modulate a signal on the first output of the up-down counter, thereby affecting the set input of the latch. Furthermore, the up-down counter may include a timer and be configured to modulate a signal on the second output of the up-down counter, thereby affecting the reset input of the latch. The reset input of the latch, as noted above, may also be coupled to the comparator output. As a result, the PWM module may cause the latch to change an output value based on comparator output events, the signal from the first output of the up-down counter, and the signal from the second output of the up-down counter. Further downstream effects may provide time delay and inversion to the latch output, thereby generating A and B control signals for switching elements in the LLC voltage converter. The operation of the up-down counter may maintain the duty cycles of the A and B control signals.

FIG. 1 shows a block diagram of an example inductor-inductor-capacitor (LLC) converter 100 and corresponding control system 150. More specifically, control system 150 provides current mode control of LLC converter 100. In this example, the control system 150 includes PWM controller 170. The PWM controller 170 includes an up-down counter, which affects inputs of a latch. A more specific example of operation of the control system 150, including PWM controller 170, is provided with respect to FIG. 2.

Various embodiments may implement the circuits of FIG. 1 on one or more semiconductor dies. Some or all of the semiconductor dies may be packaged into a semiconductor package. The circuits of FIG. 1 may be used in any of a variety of applications, such as in a power supply unit for a server rack, a power supply unit for an industrial controller, a solar generator, or the like.

The LLC converter 100 includes transistors MA, MB, MC, and MD; resonant capacitor C 115, inductor L 120, transformer 130, voltage sensing circuit 125, and the control system 150. The voltage sensing circuit 125 is configured to measure the voltage across the resonant capacitor C 115 and output a resonant capacitor voltage (VCR) signal 155 based thereon. In some implementations, the transformer 130 includes a center-tap transformer. The control system 150 includes a comparator 160, a PWM controller 170, an analog-to-digital converter (ADC) 174, an analog adder 180, and a ramp generator 185.

The transistors MA, MB, MC, and MD may be metal oxide semiconductor field-effect transistors (MOSFETs). Accordingly, MA-MD are n-type MOSFETs (NMOS) in an example. In other examples, one or more of MA-MD are p-type MOSFETs (PMOS) or bipolar junction transistors (BJTs). A BJT includes a base corresponding to the gate terminal of a MOSFET, and a collector and an emitter corresponding to the drain and source terminals of a MOSFET. The base of a BJT and the gate terminal of a MOSFET are also called control inputs. The collector and emitter of a BJT and the drain and source terminals of a MOSFET are also called current terminals.

In a MOSFET example, the bodies of each of transistors MA-MD are coupled to the respective source terminals. The source terminal of MA and the drain terminal of MB are coupled together, and the input voltage Vin 105 is applied across the drain terminal of MA and the source terminal of MB. The gate terminal of MA is configured to receive the first control signal CTLA 110A, and the gate terminal of MB is configured to receive the second control signal CTLB 110B.

The inductor L 120 has a first terminal coupled to the source terminal of MA and the drain terminal of MB and a second terminal coupled to the transformer 130. The resonant capacitor C 115 has a first terminal coupled to the source terminal of MB and a second terminal coupled to the transformer 130. The voltage sensing circuit 125 is coupled to the second terminal of the resonant capacitor C 115 and measures the voltage across the resonant capacitor C 115 and provides a signal, VCR 155, that has an analog voltage based on the measured voltage across capacitor C 115.

The transformer 130 includes a primary winding 134 and a secondary winding 138. The second terminal of the inductor L 120 is coupled to a first terminal of the primary winding 134, and the second terminal of the resonant capacitor C 115 is coupled to a second terminal of the primary winding 134. A first terminal of the secondary winding 138 is coupled to the drain terminal of MD, and a second terminal of the secondary winding 138 is coupled to the drain terminal of MC. The source terminals of MC and MD are coupled together, and the gate terminals of MC and MD are configured to receive a biasing voltage Vbias 140. The output voltage Vout 145 is taken across the center tap of transformer 130 and the source terminals of MC and MD.

In the control system 150, the comparator 160 has a first input configured to receive the VCR signal 155 representing the voltage across the resonant capacitor C 115 from the voltage sensing circuit 125, and a second input coupled to an output of the ramp generator 185 to receive the ramp signal (Vc_ramp) 190. The output 164 of comparator 160 is provided to the PWM controller 170, which outputs the control signals CTLA 110A and CTLB 110B that control the operation of transistors MA and MB, respectively. The ADC 174 receives the output voltage Vout 145, and adder 180 subtracts the output of the ADC 174 from a reference signal Vref 178, which represents the target output voltage. A voltage controller 183 receives the difference (e.g., an error) between the target output voltage represented by Vref 178 and the digitized output voltage from ADC 174 and generates a control signal for the ramp generator 185. The ramp generator 185 receives the control signal from the voltage controller 183 and generates the ramp signal 190, which can be controlled to produce a voltage that decreases linearly from a baseline voltage determined based on an error measurement provided by the adder 180. In some implementations, the control signal from the voltage controller 183 indicates the baseline value of the ramp signal 190.

FIG. 2 is an illustration of example comparator 160 and example PWM controller 170, according to various embodiments.

The comparator module 210 includes the comparator 160. At comparator 160, the inverting input receives the ramp signal (Vc_ramp) 190. The non-inverting input receives the VCR signal 155. The output of the comparator 160 changes based on the relationship of the VCR signal 155 and the ramp signal 190. The comparator output is received by OR gate 222. The OR gate 222 also receives as input the event signal PRD_EVT from up-down counter 241. The output of the OR gate 222 is used as an input to the reset input of latch 221.

The PWM controller 170 includes action qualifier (AQ) module 220, dead band (DB) module 230, and time base (TB) module 240. The output of the latch is the PWMH signal, and it is a square signal. The dead band module 230 receives the PWMH signal, adds rising edge delay and/or falling edge delay to the PWMH signal, and inverts the PWMH signal on one branch. The result is the control signals CTLA 110A and CTLB 110B. The control signals CTLA 110A and CTLB 110B are described in more detail with respect to FIG. 3. DB module 230 may be implemented in any appropriate manner, including having delay elements, inverting elements, and other elements as appropriate.

TB module 240 includes up-down counter 241. Up-down counter 241 includes counting logic to increment a count and then change direction to decrement the count. Up-down counter 241 is also programmed to modulate event signal ZERO_EVT upon the counter reaching a preconfigured number, which in this example is 0. For instance, a particular counting cycle may start at 0, and the up-down counter 241 may then increment the count starting at zero and increasing and, upon a trigger, begin decrementing the count until reaching 0. At reaching zero, the up-down counter 241 modulates the event signal ZERO_EVT.

Any appropriate trigger may be used in the logic of up-down counter 241. In this example, a trigger includes comparator output signal 164 having a rising edge. Furthermore, another trigger that may be used is timer 242 reaching another preconfigured number. The timer 242 may provide a failsafe should the voltage of the VCR signal 155 fail to rise to the voltage of the Vc_ramp signal 190 within a given time period and may be programmed using any appropriate preconfigured number. For instance, a designer may choose a timer duration based on a maximum period for a switching cycle and then divide that maximum period by two. The designer may set the logic of the up-down counter 241 to switch from incrementing to decrementing when the timer reaches the maximum period divided by two. An example is discussed in more detail with respect to FIG. 3.

Further in this example, the logic of the up-down counter 241 may modulate the event signal PRD_EVT when the timer reaches the preconfigured number (e.g., the highest maximum total period divided by two). In some examples, modulating the PRD_EVT signal may include outputting a rising edge (e.g., thereby asserting the PRD_EVT signal), and the same may be true of modulating the ZERO_EVT signal as well. However, the scope of implementations may include any appropriate modulation.

The event signal ZERO_EVT is also used in this example to affect the ramp signal Vc_ramp. For instance, the event signal ZERO_EVT may be used as an input to ramp generator 185. The ramp generator 185 includes logic to control the timing of the ramp signal Vc_ramp. For instance, the logic of ramp generator 185 may cause Vc_ramp to begin counting down upon modulation of the event signal ZERO_EVT. For instance, when the up-down counter 241 reaches zero, that may result in the ZERO_EVT signal being modulated, which is also received by the ramp generator 185, which then causes the ramp signal Vc_ramp to begin decreasing. The logic of ramp generator 185 may also cause the ramp signal Vc_ramp to return to a previous high value and begin to increase whenever there is a comparator event (e.g., a rising edge on the comparator output signal 164).

The up-down counter 241 is, in this example, more complex than either an up-counter or a down counter. Specifically, the up-down counter 241 includes logic to count up and count down and to change from counting up to counting down and then to change to counting up again. The behavior of the up-down counter 241 is described above and with respect to FIG. 3. The up-down counter 241 may be implemented in any appropriate manner, including using hardware logic; however, the scope of implementations may even include firmware-based or software-based counters and logic.

The AQ module 220 includes latch 221. In this example, latch 221 is a set-reset (SR) latch, having a set input and a reset input. The reset input is coupled to the output of OR gate 222. The set input is coupled to the ZERO_EVT signal.

A set-reset latch may be a type of digital circuit that can be used to store a single bit of information. The state of latch 221 may be determined by the combination of inputs and its current state. A truth table for latch 221 is provided immediately below in Table 1.

TABLE 1

| Set (S) | Reset (R) | Q (Output) | Q' (Complement of Output) |
|---|---|---|---|
| 0 | 0 | Q(t-1) | Q'(t-1) |
| 0 | 1 | 0 | 1 |
| 1 | 0 | 1 | 0 |
| 1 | 1 | Indeterminate | Indeterminate |

Set(S): Input that, when asserted (S=1), sets the latch to the 'set' state.

Reset (R): Input that, when asserted (R=1), resets the latch to the 'reset' state.

Q (Output): The current state of the latch output.

Q' (Complement of Output): The complement of the current state of the latch output.

Indeterminate: When both Set and Reset are asserted simultaneously (S=1 and R=1), the output state is indeterminate, and it may avoided in some applications.

In the present example of Table 1, the Q(t–1) and Q'(t–1) columns represent the previous state of the latch, and the values in the Q and Q' columns represent the next state based on the current inputs. An SR latch, such as latch 221, has the ability to remember its state, and it can be set, reset, or maintain its current state based on the input conditions.

Of course, the scope of implementations is not limited to using only a set-reset latch. Rather, another implementation may use a reset-set latch and rearrange the inputs, though the zero event ZERO_EVT signal, the PRD_EVT signal, and comparator events may still be used to control the output value of the latch.

FIG. 3 is an illustration of the timing relationships of various signals of FIG. 2, according to various embodiments. However, the counter 241 as illustrated in FIG. 3 is not a signal, but rather, is a representation of the count.

The VCR signal 155, as mentioned above, is based on a voltage across the resonant capacitor 115 of FIG. 1. It may vary from a uniform sinusoid to a more irregular shape from time to time (e.g., depending on a load coupled to Vout). This variation is illustrated in FIG. 3, where the VCR signal 155 appears to be a uniform sinusoid up until about time T2 and then shows irregularities after time T2. The VCR signal 155 is received at the non-inverting input of comparator 160 and, therefore, the amplitude of the VCR signal 155 affects the output of the comparator 160. The other input to the comparator 160, at the inverting input, is the ramp signal Vc_ramp 190. As shown in FIG. 1, Vc_ramp 190 is generated, at least in part, based upon an error signal Vc from the voltage controller 183.

Before time T0, the CTLA 110A is low, and CTLB 110B is high, as they are inversely related. At time T0, there is a zero event at the counter 241. The zero event causes the up-down counter 241 to modulate the ZERO_EVT signal (e.g., assert the ZERO_EVT signal as long as the count of the up-down counter 241 is zero), which is received at the set input of latch 221. The ZERO_EVT signal at the set input causes the output PWMH of latch 221 to change values, and that is further illustrated by CTLA 110A and CTLB 110B signals changing values immediately following time T0 (e.g., CTLA 110A is asserted and CTLB 110B is de-asserted). The ZERO_EVT signal also causes the ramp generator to begin decreasing the voltage of the ramp signal Vc_ramp 190

The up-down counter 241 increments the count between times T0 and T1. At time T1, there is a comparator event because the ramp signal Vc_ramp 190 is equal to the value of the VCR signal 155. Accordingly, the comparator event causes a rising edge on the comparator output signal 164. The logic of the up-down counter 241 stops incrementing and begins decrementing in response to the comparator event on signal 164. The comparator event on signal 164 causes the value at the reset input of latch 221 to change, which also causes the latch output PWMH to change. This is further illustrated by CTLA 110A and CTLB 110B signals changing values immediately following time T1 (e.g., CTLA 110A is de-asserted and CTLB 110B is asserted).

Continuing immediately after time T1, the up-down counter 241 continues to decrement until it reaches zero, which is a zero event, at time T2. The zero event causes the up-down counter 241 to modulate the ZERO_EVT signal, which is received at the set input of latch 221. The ZERO_EVT signal at the set input causes the output PWMH of latch 221 to change values, and that is further illustrated by CTLA 110A and CTLB 110B signals changing values immediately following time T2.

In this example, of note at time T2 is that the duty cycle of CTLA 110A is substantially 50% between times T0 and T2. Specifically, CTLA 110A is high from time T0 to time T1 and is low from time T1 to time T2. The elapsed time from time T0 to time T1 is substantially the same as the elapsed time from time T1 to time T2. The duty cycle is also 50% for the signal CTLB 110B, which is an inverse of CTLA 110A. Such feature is a result of the up-down counter 241, which has an elapsed decrementing time match an elapsed incrementing time for each cycle. Furthermore, the high time and low time for each signal CTLA 110A and CTLA 11B is determined by the up-down counter 241 reacting to the comparator event at time T1, at least for the cycle at T0 to T2.

After about time T2, the VCR signal 155 varies from a regular sinusoid, taking on a longer period and a higher amplitude due to, for example, a higher current draw by a load. As a result, there is a longer elapsed time from time T2 to time T3 than there was from time T1 to time T2. The logic of the up-down counter 241 causes the up-down counter 241 to stop decrementing and begin incrementing at the zero event of time T2, so the up-down counter 241 increments the count between times T2 and T3. As noted above, the logic of the up-down counter 241 causes the up-down counter 241 to switch from incrementing to decrementing in response to one of two conditions—a comparator event and a timer event. In the example of time T3, the up-down counter 241 encounters a timer event. Specifically, the timer of up-down counter 241 reaches a preconfigured value, and the logic of the up-down counter 241, in response to the timer event, switches from incrementing to decrementing at time T3. The logic of the up-down counter 241 also modulates the PRD_EVT signal, which is an input to the OR gate 222. As a result, the value at the reset input of latch 221 changes, which also changes the output of the latch PWMH. The control signals CTLA 110A and CTLB 100B, thus, also change values immediately following time T3.

Between times T3 and T5, the up-down counter 241 decrements the count until it reaches zero. As noted above, during a particular cycle, the elapsed decrementing time matches the elapsed incrementing time, so that the elapsed time between times T3 and T5 matches the elapsed time between times T2 and T3.

Further in this example, the logic of the up-down counter is configured so that it does not switch from decrementing to incrementing should a comparator event occur during a decrementing part of the cycle. This is illustrated at time T4, where VCR signal 155 equals an amplitude value of Vc_ramp signal 190, thereby causing a rising edge on the comparator output signal 164. However, the output of the OR gate 222 remains the same, so that the values at the reset input and the set input of latch 221 remain the same at time T4. Thus, at time T4, the up-down counter 241 continues to decrement the count, and the values of the signals CTLA 110A and CTLB 110B remain the same.

Once again, the duty cycle between times T2 and T5 is substantially 50%. At time T5 is another zero event, and another counting cycle begins (not shown). Dashed lines are used to indicate further counting cycles in FIG. 3.

The scope of implementations is not limited to the specific counting functionality of the up-down counter 241. For instance, various embodiments may be adapted to use a counter having logic to count up and count down when the up-down counter of 241 would count down and up, respectively. In such an instance, the logic of the counter may be configured to use a preconfigured value instead of zero to trigger what are referred to as zero events in the description above.

The ramp generator 185 of FIGS. 1, 2 generates the Vc_ramp signal 190. The ramp generator 185 may include logic to generate Vc_ramp in response to the error signal Vc and the ZERO_EVT signal. At a zero event, the ramp generator logic receives ZERO_EVT signal, and then the logic updates the value of Vc_ramp with a new reference level. The reference level is determined by the logic and may be based on the amplitude of the error signal Vc. The control system uses the reference level to determine the PWM frequency for the next counting cycle. Examples of reference levels are the Vc_ramp levels at TO, T2, T5. Also, at each zero event, the logic of the ramp generator 185 causes the Vc_ramp level to count down. And when a comparator event occurs (e.g., Vc_ramp value equals the VCR signal value), the logic of ramp generator 185 resets Vc_ramp to its currently-stored reference level. For instance, at time T1, the logic of the ramp generator 185 resets the value of Vc_ramp to the value that Vc_ramp had at time T0. Similarly, at time T4, the logic of the ramp generator 185 resets the value of Vc_ramp to the value that Vc_ramp had at time T2.

As noted above, control system 150 provides current mode control of LLC converter 100. Specifically, in the example of FIG. 1, the voltage sensed by voltage sensing circuit 125 is a proxy for the current in primary winding 134. In other words, the control system 150 provides control based, at least in part, in response to current on the primary winding side of the voltage converter 100. Current mode control is generally expected to operate more optimally if the on time of CTLA 110A (high-side) and the on time of CTLB 110B (low-side) are the same, despite any fluctuations in a load. In the example of FIG. 3, some fluctuation begins between time T2 and time T3. Nevertheless, the on time of CTLA 110A is a same elapsed time of CTLB 110B between times T0 and T2, and the on time of CTLA 110A is a same elapsed time of CTLB 110B between times T2 and T5, even those on times are different in each counting cycle.

Put another way, the high-side on time in the first counting cycle is T1 minus T0, and the low-side on time in the first counting cycle is T2 minus T1. They are the same. The high-side on time in the second counting cycle is T3 minus T2, and the low-side on time in the second counting cycle is T5 minus T3. Once again, the on times are the same for the high-side and the low-side during the second counting cycle, even though the second counting cycle is longer than the first counting cycle. The control system 150 maintains the duty cycle of both CTLA 110A and CTLB 110B at 50% from counting cycle to counting cycle, even beyond time T5.

An advantage of some embodiments is that the high-side and low-side on time for each counting cycle may allow for the LLC converter to handle higher load transients. For instance, the LLC converter of FIG. 1 may power a load (not shown) at Vout, and that load may change over time, thereby causing variations in the VCR signal 155. Embodiments described herein, which keep the high-side and low-side on time the same in each counting cycle, may provide for more precise response, thereby keeping a voltage regulation limit within a particular specification (e.g., 4% or 6%). Furthermore, the embodiments described herein may provide for a 50% duty cycle through use of an up-down counter, having relatively simple logic, rather than through use of a more complex and expensive configurable logic block (e.g., a field programmable gate array or the like). Nevertheless, the scope of implementations does not exclude the use of configurable logic blocks where appropriate.

FIG. 4 is an illustration of example method 400, for controlling a current mode-controlled LLC converter, according to various embodiments. The method 400 may be performed by a circuit, such as PWM controller 170, shown in FIG. 2.

At action 402, logic of the up-down counter increments the count. At action 404, the PWM controller receives a signal edge on a comparator output. At action 406, the signal edge causes the up-down counter to switch from incrementing the count to decrementing the count. An example is shown in FIG. 3 at times T0-T1, where the up-down counter 241 switches from incrementing to decrementing.

At action 408, the up-down counter decrements the count to zero and, at action 410, generates a first event signal. In this example, that may include providing the first event signal to a first latch input, thereby changing a latch output level. An example is described above with respect to FIG. 3, at the zero events at times T2 and T5. An example first event signal may include the ZERO_EVT signal, which is modulated by the up-down counter 241 and is used as an input to both the latch 221 and the ramp generator 185.

At action 412, the PWM controller changes the values of the first control signal and the second control signal. An example is shown immediately following time T2, where the ZERO_EVT signal at the set input of latch 221 causes the control signals CTLA 110A and CTLB 110B to change values.

Following the count reaching zero at action 408, the up-down counter begins incrementing the count, as illustrated at action 414. The up-down counter continues to increment the count until the timer elapses at action 416. This is illustrated at time T3 of FIG. 3.

In response to the timer elapsing at action 416, the up-down counter generates a second event signal at action 418. For instance, the up-down counter may provide a second event signal to a second latch input, thereby changing the latch output level. In the example of time T3 of FIG. 3, the up-down counter 241 modulates the PRD_EVT signal, which changes a value at the reset input of latch 221, thereby changing the values of the control signals CTLA 110A and CTLB 110B.

At action 420, the PWM controller changes the values of the first control signal and the second control signal. This is illustrated immediately after time T3 in FIG. 3, where the control signals CTLA 110A and CTLB 110B change values in response to operation of the latch 221.

The method 400 illustrates two counting cycles. In a first counting cycle, the incrementing is switched to decrementing in response to a signal edge on the comparator output (action 404). In the second counting cycle, the incrementing is switched to decrementing in response to the timer elapsing (action 416). Further counting cycles may be performed, and the counting cycles may be affected by an error signal (e.g., Vc of FIG. 1) and by a resonant capacitor feedback signal (VCR signal 155). Nevertheless, as noted above, the up-down counter maintains equal times for incrementing and decrementing with each counting cycle, thereby maintaining a 50% duty cycle of the control signals CTLA 110A and CTLB 110B.

Various embodiments may add, omit, rearrange, or modify ones of the actions of method 400. For instance, as noted above, the scope of implementations may include a counter that decrements first and then switches to incrementing and uses a different preconfigured number other than zero for the zero event actions. In such an embodiment, action 402 may include decrementing the count, action 406 may include switching from decrementing to incrementing, action 408 may include incrementing the count to the preconfigured number other than zero, and action 414 may include decrementing the count.

The term "semiconductor die" is used herein. A semiconductor device can be a discrete semiconductor device such as a bipolar transistor, a few discrete devices such as a pair of power FET switches fabricated together on a single semiconductor die, or a semiconductor die can be an integrated circuit with multiple semiconductor devices such as the multiple capacitors in an A/D converter. The semiconductor device can include passive devices such as resistors, inductors, filters, sensors, or active devices such as transistors. The semiconductor device can be an integrated circuit with hundreds or thousands of transistors coupled to form a functional circuit, for example a microprocessor or memory device. The semiconductor device may also be referred to herein as a semiconductor device or an integrated circuit (IC) die.

The term "semiconductor package" is used herein. A semiconductor package has at least one semiconductor die electrically coupled to terminals and has a package body that protects and covers the semiconductor die. In some arrangements, multiple semiconductor dies can be packaged together. For example, a power metal oxide semiconductor (MOS) field effect transistor (FET) semiconductor device and a second semiconductor device (such as a gate driver die, or a controller die) can be packaged together to from a single packaged electronic device. Additional components such as passive components, such as capacitors, resistors, and inductors or coils, can be included in the packaged electronic device. The semiconductor die is mounted with a package substrate that provides conductive leads. A portion of the conductive leads form the terminals for the packaged device. In wire bonded integrated circuit packages, bond wires couple conductive leads of a package substrate to bond pads on the semiconductor die. The semiconductor die can be mounted to the package substrate with a device side surface facing away from the substrate and a backside surface facing and mounted to a die pad of the package substrate. The semiconductor package can have a package body formed by a thermoset epoxy resin mold compound in a molding process, or by the use of epoxy, plastics, or resins that are liquid at room temperature and are subsequently cured. The package body may provide a hermetic package for the packaged device. The package body may be formed in a mold using an encapsulation process, however, a portion of the leads of the package substrate are not covered during encapsulation, these exposed lead portions form the terminals for the semiconductor package. The semiconductor package may also be referred to as a "integrated circuit package," a "microelectronic device package," or a "semiconductor device package."

While various examples of the present disclosure have been described above, it should be understood that they have been presented by way of example only and not limitation. Numerous changes to the disclosed examples can be made in accordance with the disclosure herein without departing from the spirit or scope of the disclosure. Modifications are possible in the described embodiments, and other embodiments are possible, within the scope of the claims. Thus, the breadth and scope of the present invention should not be limited by any of the examples described above. Rather, the scope of the disclosure should be defined in accordance with the following claims and their equivalents.

What is claimed is:

1. A circuit comprising:
a comparator having a first comparator input, a second comparator input, and a comparator output;
a latch having a first latch input, a second latch input, and a latch output;
an up-down counter having a first input coupled to the comparator output, wherein:
the first latch input is coupled to a first output of the up-down counter;
the second latch input is coupled to a second output of the up-down counter; and
the second latch input is coupled to the comparator output.

2. The circuit of claim 1, wherein the up-down counter is configured to increment a count and decrement the count, wherein the up-down counter is configured to switch from incrementing the count to decrementing the count in response to the comparator output.

3. The circuit of claim 1, wherein the up-down counter is configured to modulate the first output of the up-down counter in response to counting to a preconfigured value.

4. The circuit of claim 3, wherein the preconfigured value is zero.

5. The circuit of claim 1, wherein the up-down counter includes a timer, wherein the up-down counter is configured to modulate the first output of the up-down counter in response to a preconfigured time elapsing.

6. The circuit of claim 1, wherein the first comparator input is coupled to a resonant capacitor voltage, and wherein the second comparator input is coupled to a ramp generator circuit.

7. The circuit of claim 6, further comprising a ramp signal voltage generator configured to receive the first output of the up-down counter, wherein the ramp signal voltage generator is coupled to the second comparator input.

8. The circuit of claim 1, further comprising a logic gate coupled to the second latch input, wherein the logic gate is coupled to the comparator output and the first output of the up-down counter.

9. The circuit of claim 1, wherein the latch comprises a set-reset latch, and wherein the first latch input comprises a set input, and wherein the second latch input comprises a reset input.

10. A voltage converter system comprising:
an inductor-inductor-capacitor (LLC) voltage converter having a resonant capacitor and a resonant inductor; and
a control circuit configured to provide a first control signal and a second control signal to the LLC voltage converter, wherein the control circuit comprises:
a comparator configured to:
receive a first voltage signal based on a voltage of the resonant capacitor;
receive a second voltage signal, which is a ramp signal; and
output a comparator output signal;
an up-down counter configured to receive the comparator output signal, further wherein the up-down counter is configured to output a first event signal in response to counting a preconfigured value;
a latch having a first latch input and a second latch input, wherein the latch is configured to receive the first event signal at the first latch input and to receive a signal based on the comparator output signal at the second latch input; and
an output signal module, configured to:
receive a latch output from the latch; and
generate the first control signal and the second control signal from the latch output.

11. The voltage converter system of claim 10, wherein the preconfigured value is zero.

12. The voltage converter system of claim 10, wherein the latch comprises a set-reset latch, wherein the first latch input comprises a set input, and wherein the second latch input comprises a reset input.

13. The voltage converter system of claim 10, wherein the first control signal and the second control signal have an inverted relationship.

14. The voltage converter system of claim 13, wherein the first control signal has a same duty cycle as the second control signal.

15. The voltage converter system of claim 10, wherein the up-down counter is configured to switch from counting up to counting down in response to the comparator output signal.

16. The voltage converter system of claim 10, wherein the up-down counter is configured to switch from counting up to counting down in response to an elapsed time, further wherein the up-down counter is further configured to output a second event signal in response to the elapsed time, wherein the signal derived from the comparator output signal is further derived from the second event signal.

17. The voltage converter system of claim 16, further comprising an OR logic gate configured to receive the comparator output signal and the second event signal and configured to output the signal derived from the comparator output signal.

18. A voltage converter controller comprising:

a comparator configured to receive a feedback signal and a ramp signal, the comparator being further configured to output a comparator output;

a pulse width modulation (PWM) module configured to receive the comparator output and to generate a first control signal and a second control signal, wherein the PWM module is configured to:

increment a count on an up-down counter;

receive a signal edge on the comparator output;

switch from incrementing the count to decrementing the count on the up-down counter in response to the signal edge on the comparator output;

decrement the count to zero;

generate a first event signal in response to switching from incrementing the count to decrementing the count, including providing the first event signal to a first latch input, thereby changing a latch output level; and change values of the first control signal and the second control signal in response to the latch output level.

19. The voltage converter controller of claim 18, wherein the feedback signal includes a resonant capacitor voltage from a voltage converter, and wherein the ramp signal is derived from the first event signal.

20. The voltage converter controller of claim 18, wherein the PWM module is further configured to:

increment the count subsequent to decrementing the count to zero;

determine that a timer has elapsed while incrementing the count;

generate a second event signal in response to the timer elapsing, including providing the second event signal to a second latch input, thereby changing the latch output level; and changing the values of the first control signal and the second control signal in response to the latch output level.

\* \* \* \* \*